(12) United States Patent
Gimat et al.

(10) Patent No.: US 10,019,549 B2
(45) Date of Patent: Jul. 10, 2018

(54) METHOD OF DESIGNING A COMMON PREFORM FOR PROVIDING PREFORMS FOR TURBINE ENGINE OUTLET GUIDE VANES OF DIFFERENT GEOMETRICAL PROFILES AND MADE OUT OF COMPOSITE MATERIAL

(71) Applicants: SNECMA, Paris (FR); SAFRAN, Paris (FR)

(72) Inventors: Matthieu Gimat, Paris (FR); Dominique Marie Christian Coupe, Le Haillan (FR); Jean-Nöel Mahieu, Gentilly (FR); Yann Didier Simon Marchal, Melun (FR)

(73) Assignees: SNECMA, Paris (FR); SAFRAN, Paris (FR)

( * ) Notice: Subject to any disclaimer, the term of this patent is extended or adjusted under 35 U.S.C. 154(b) by 0 days.

(21) Appl. No.: 14/863,871

(22) Filed: Sep. 24, 2015

(65) Prior Publication Data

US 2016/0012178 A1 Jan. 14, 2016

Related U.S. Application Data

(63) Continuation-in-part of application No. PCT/FR2014/050670, filed on Mar. 21, 2014.

(30) Foreign Application Priority Data

Mar. 25, 2013 (FR) ...................................... 13 52638

(51) Int. Cl.
*F01D 9/02* (2006.01)
*G06F 17/50* (2006.01)
(Continued)

(52) U.S. Cl.
CPC .......... *G06F 17/5086* (2013.01); *B29B 11/16* (2013.01); *B29C 64/106* (2017.08);
(Continued)

(58) Field of Classification Search
CPC ... G06F 17/5086; G05B 19/4097; F01D 9/02; F01D 25/005
(Continued)

(56) References Cited

U.S. PATENT DOCUMENTS

2004/0021828 A1* 2/2004 Evans ..................... B29C 70/34
353/28
2005/0084377 A1 4/2005 Dambrine et al.
(Continued)

FOREIGN PATENT DOCUMENTS

EP 2 562 361 A1 2/2013
WO WO 2013/088040 A2 6/2013

OTHER PUBLICATIONS

International Preliminary Report on Patentability and Written Opinion of the International Searching Authority as issued in International Patent Application No. PCT/FR2014/050670, dated Sep. 29, 2015.
(Continued)

*Primary Examiner* — Woody Lee, Jr.
*Assistant Examiner* — Maxime Adjagbe
(74) *Attorney, Agent, or Firm* — Pillsbury Winthrop Shaw Pittman LLP

(57) ABSTRACT

A method of designing a common preform for providing a plurality of preforms for turbine engine outlet guide vanes of different geometrical profiles and made out of composite material, the method including 3D geometrical modeling of the geometrical profiles of the different outlet guide vane preforms, flattening out each of the geometrical profiles of the different outlet guide vane preforms, superposing the
(Continued)

geometrical profiles of the different flattened outlet guide vane preforms, and converging towards a single geometrical profile for an outlet guide vane preform common to all of the outlet guide vane preforms while guaranteeing identical positioning for the top and bottom regions of non-interlinking for all of the outlet guide vane preforms.

5 Claims, 2 Drawing Sheets

(51) Int. Cl.
B29C 67/00 (2017.01)
B29B 11/16 (2006.01)
F01D 25/00 (2006.01)
B29C 64/106 (2017.01)
B29C 70/24 (2006.01)
B29L 31/08 (2006.01)

(52) U.S. Cl.
CPC ............ B29C 67/0055 (2013.01); F01D 9/02 (2013.01); F01D 25/005 (2013.01); G06F 17/5009 (2013.01); B29C 70/24 (2013.01); B29L 2031/08 (2013.01)

(58) Field of Classification Search
USPC .......................................... 700/97, 98, 182
See application file for complete search history.

(56) References Cited

U.S. PATENT DOCUMENTS

2011/0110787 A1* 5/2011 Belmonte ............... B29B 11/16
416/223 R
2012/0171044 A1 7/2012 Berard et al.

OTHER PUBLICATIONS

International Search Report as issued in International Patent Application No. PCT/FR2014/050670, dated Jun. 10, 2014.

* cited by examiner

METHOD OF DESIGNING A COMMON PREFORM FOR PROVIDING PREFORMS FOR TURBINE ENGINE OUTLET GUIDE VANES OF DIFFERENT GEOMETRICAL PROFILES AND MADE OUT OF COMPOSITE MATERIAL

CROSS REFERENCE TO RELATED APPLICATIONS

This application is the Continuation-In-Part of PCT/FR2014/050670 filed Mar. 21, 2014, which in turn claims priority to French Application No. 1352638 filed Mar. 25, 2013. The contents of both applications are incorporated herein by reference in their entirety.

FIELD

The present invention relates to the general field of outlet guide vanes made of composite material for use in turbine engines. The invention relates more particularly to preparing the geometrical profile of the fiber preforms that are used for fabricating such outlet guide vanes.

BACKGROUND

In a turbine engine, an intermediate casing is a structural element of the engine and it comprises a hub supporting the shafts of the various rotors of the turbojet. An outer annular casing is connected to the hub of the intermediate casing via radial connection arms that serve in particular to transmit some of the forces between the engine and its support, and also via a plurality of outlet guide vanes (OGVs) that serve to straighten out the secondary stream along the axis of the engine.

The presence of connection arms within the intermediate casing leads to significant aerodynamic disturbance for the outlet guide vanes. These outlet guide vanes (there typically being 30 to 50 of them) must therefore accommodate the aerodynamic disturbance caused by the connection arms. For this purpose, the geometrical profiles of these vanes vary gradually all around the circumference of the OGV wheel. By way of example, for an OGV wheel having 40 outlet guide vanes, it may be necessary to use seven to ten different geometrical profiles.

Furthermore, it is known to have recourse to composite materials for making various parts of an aviation turbine engine. Such a part may thus be obtained by making a fiber preform and by densifying the preform with a matrix. Depending on the intended application, the preform may be made of glass, carbon, or ceramic fibers and the matrix may be made of an organic material (polymer), or of carbon, or of ceramic. Reference may be made to international patent application PCT/FR2012/052853 filed on Dec. 10, 2012, which describes an example of fabricating outlet guide vanes out of composite material.

The use of N different geometrical profiles for making a single turbine engine OGV wheel makes it necessary to multiply by N the steps of fabricating outlet guide vanes out of composite material, thereby correspondingly increasing the cost and the duration of fabricating the OGV wheel.

SUMMARY

An aspect of the present invention is thus to mitigate such drawbacks by proposing to optimize and rationalize the design of a turbine engine OGV wheel.

In accordance with an embodiment of the invention, this aspect is achieved by a method of designing a common preform for providing a plurality of preforms for turbine engine outlet guide vanes of different geometrical profiles and made out of composite material, the common preform being made from a single-piece woven fiber structure obtained by three-dimensional weaving, the fiber structure having first and second portions, each comprising a plurality of layers of yarns and each forming a fraction of the thickness of the fiber structure, the portions of the fiber structure being interlinked while leaving top and bottom regions of non-interlinking separating the first and second portions over respective fractions of the dimension of the fiber structure from opposite edges of the fiber structure, the method being performed by graphics software of a workstation and comprising:

- 3D geometrical modeling of the geometrical profiles of the different outlet guide vane preforms;
- flattening out each of the geometrical profiles of the different outlet guide vane preforms;
- superposing the geometrical profiles of the different flattened outlet guide vane preforms; and
- converging towards a single geometrical profile for an outlet guide vane preform common to all of the outlet guide vane preforms while guaranteeing identical positioning for the top and bottom regions of non-interlinking for all of the outlet guide vane preforms.

The method of an embodiment of the invention is remarkable in that it proposes making a common fiber preform suitable for use in forming the N different geometrical profiles for all of the outlet guide vanes of a given OGV wheel. By designing a single common fiber preform for making the N different geometrical profiles of the outlet guide vanes, the design of the OGV wheel is simplified considerably. In particular, there is no longer any need to multiply the vane fabrication steps by the number of outlet guide vanes making up the OGV wheel.

In an embodiment, the convergence on a single geometrical profile is performed by limiting the framing differences between the different geometrical profiles for outlet guide vane preforms.

Also, the convergence on a single geometrical profile is performed by limiting the thickness differences between the different geometrical profiles for the outlet guide vane preforms.

An aspect of the invention also provides a turbine engine outlet guide vane fabricated from a preform obtained by a method as defined above.

Likewise, an aspect of the invention provides a turbine engine outlet guide vane wheel comprising a plurality of outlet guide vanes fabricated from a common preform. The preform may be obtained by a method as defined above.

An aspect of the invention also provides a turbine engine including such a wheel.

BRIEF DESCRIPTION OF THE DRAWINGS

Other characteristics and benefits of the present invention appear from the following description made with reference to the accompanying drawings which show an implementation having no limiting character. In the figures.

DETAILED DESCRIPTION

Figure 1:
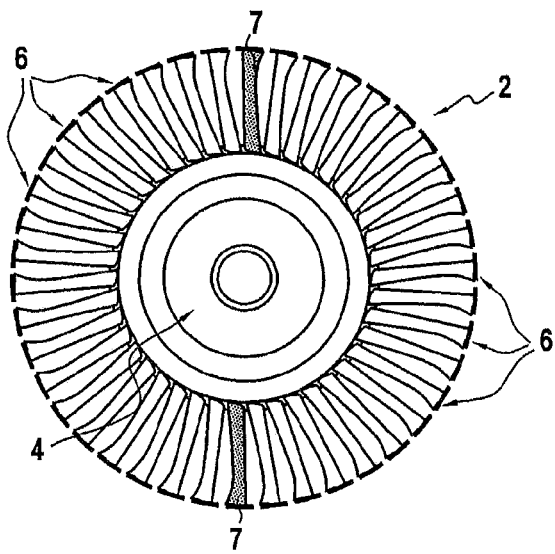
FIG. 1 is a diagrammatic face view of an OGV wheel of a turbojet.

An aspect of the invention relates to the design of a turbine engine outlet guide vane wheel made out of composite material, such as the wheel 2 shown in FIG. 1.

In known manner, an intermediate casing OGV wheel 2 is arranged behind the fan of the turbine engine in order to straighten out the secondary air stream along the axis of the engine. This wheel comprises in particular a hub 4 having a plurality of outlet guide vanes 6 mounted thereon (e.g. 40 of them).

Figure 2:
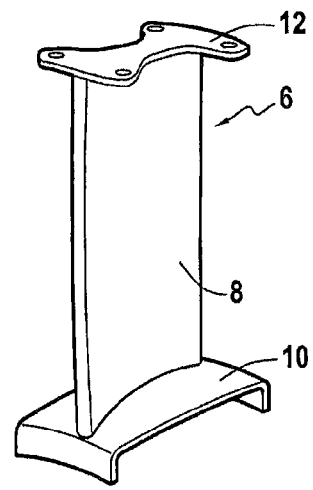
FIG. 2 is a diagrammatic view of an outlet guide vane forming part of the OGV wheel of FIG. 1.

The OGV wheel 2 also has two radial connection arms 7 that serve in particular to transmit some of the forces between the engine and its support. In the example of FIG. 2, these connection arms are arranged at 12 o'clock and at 6 o'clock.

As shown in FIG. 2, each outlet guide vane 6 of the OGV wheel comprises an airfoil 8 terminating at a radially inner end in an inner platform 10 for mounting on the hub 4 of the OGV wheel 2, and at a radially outer end in an outer platform 12 for fastening to an outer shroud (not shown in the figures). The outlet guide vane 6 presents a section that is substantially I-shaped, as shown in dashed lines in FIG. 2.

The camber and the aerodynamic profile of the airfoil 8 of the outlet guide vanes 6 vary over a given OGV wheel 2. For example, an OGV wheel having 40 outlet guide vanes may include seven different combinations of camber and of aerodynamic airfoil profile.

For the fabrication of such outlet guide vanes 6 out of composite material, reference may be made to the international patent application PCT/FR2012/052853 filed by the Applicant on Dec. 10, 2012, the content of which is incorporated herein by reference.

Briefly, in order to fabricate an outlet guide vane, use is made of a single-piece three-dimensionally (3D) woven fiber structure having two portions respectively forming first and second thickness portions of the fiber structure. Each portion comprises a plurality of superposed layers of warp yarns and the two portions of the fiber blank are interlinked by weft yarns from a plurality of layers of weft yarns while leaving regions of non-interlinking at the top and at the bottom to separate the first portion from the second portion over respective fractions of the length of the fiber structure starting from opposite edges of the fiber structure. Each region of non-interlinking extends from an edge of the fiber structure to a bottom of the non-interlinking.

The term "non-interlinking" is used herein to mean a zone that is not crossed by weft yarns linking together the warp yarns of layers belonging to respective ones of the two portions of the fiber structure.

A fiber preform of substantially I-shaped section can then be obtained from such a fiber structure, in particular by folding out those fractions of the fiber structure portions that lie on either side of the bottom and top regions of non-interlinking. The fraction of the fiber blank for which the two portions are interlinked is also shaped so as to give a camber and an aerodynamic profile to the airfoil of the outlet guide vane. The fiber preform as obtained in this way is then densified with a matrix in order to obtain an outlet guide vane as shown in FIG. 2.

An embodiment of the invention provides a method of designing a common preform for making fiber preforms for use in fabricating a plurality of outlet guide vanes 6 (i.e. at least two of them) for the OGV wheel 2.

In accordance with this method, provision is made initially to provide a 3G geometrical model of the profiles of the various outlet guide vane preforms for which it is desired to devise a common preform. This modeling step is performed using appropriate graphics software in a workstation.

The workstation includes one or more processors that is/are configured to execute machine or computer executable instructions for carrying out or causing to carry out the method(s), step(s) of the method(s) and procedure(s), e.g. the function(s) of the simulation described below.

For example, execution of the sequences of machine instructions contained in a memory causes the processor(s) or processing unit(s) to perform at least some of the process steps or function(s) of the procedures described herein. One or more physical processors or physical processing units in a multi-processing arrangement may also be employed to execute the sequences of instructions contained in the memory or machine/computer readable medium. In alternative embodiments, hard-wired circuitry may be used in place of or in combination with software instructions.

The term "computer readable medium" or "machine readable medium" or "machine storage medium" or "memory" as used herein refers to any medium that participates in providing instructions to a processor or processing unit for execution. Such a medium is non-transitory and may take many forms, including but not limited to, non-volatile media, volatile media, and transmission media. Non-volatile media include, for example, optical or magnetic disks. Volatile media include dynamic memory. Transmission media include coaxial cables, copper wire and fiber optics. Common forms of computer/machine readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer/machine readable media may be involved in carrying one or more sequences of one or more instructions to processor for execution.

Computer programs comprising machine executable instructions for implementing at least one of the steps of the method described herein or function(s) of various elements of the structural arrangement can be implemented by one or more computers or computing modules comprising at least an interface, a physical processor and a non-transitory memory (also broadly referred to as a non-transitory machine readable or storage medium). The computer is a special purpose computer as it is programmed to perform specific steps of the method(s) and the function(s) described above. The non-transitory memory is encoded or programmed with specific code instructions for carrying out the above method(s) and its/their associated steps. The non-transitory memory may be arranged in communication with the physical processor or processing units so that the physical processor, in use, reads and executes the specific code instructions embedded in the non-transitory memory. The interface of the special purpose computer may be arranged in communication with the physical processor and receives input parameters that are processed by the physical processor.

Figure 3:
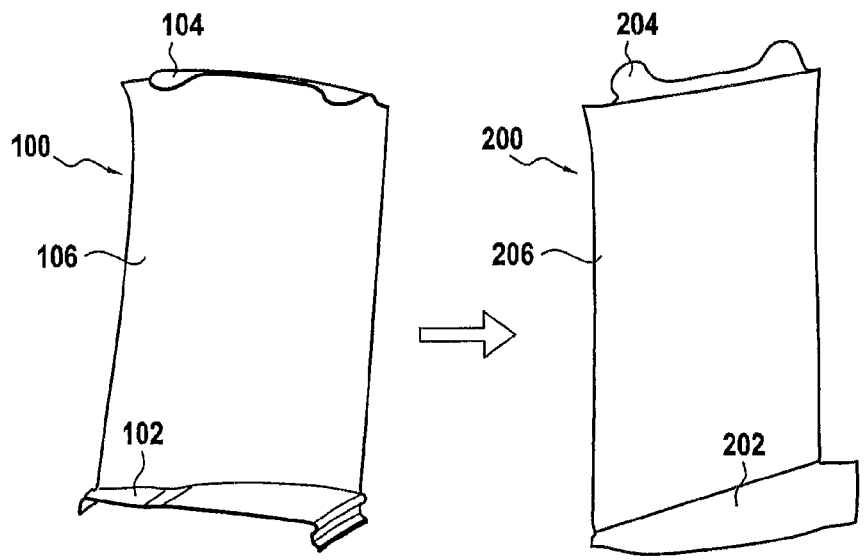
FIGS. 3 to 5 show various steps in implementing the method of the invention.

As shown in FIG. 3, the geometrical profile 100 as 3D modelled in this way for each outlet guide vane preform comprises a portion 102 constituting an inner platform, a portion 104 constituting an outer platform, and a portion 106 constituting an airfoil.

Each geometrical profile 100 is then flattened out in order to obtain a two-dimensional (2D) geometrical profile 200. This step, which is likewise performed by means of graphics software, consists in folding in and flattening the 3D geometrical profile of the preform. References 202, 204, and 206 in FIG. 3 designate respectively the component portions of the inner platform, of the outer platform, and of the airfoil, once laid out flat.

Starting from the 2D geometrical profile of each preform, the following step of the method of the invention consists in graphically superposing the 2D geometrical profiles of different outlet guide vane preforms.

Figure 4:
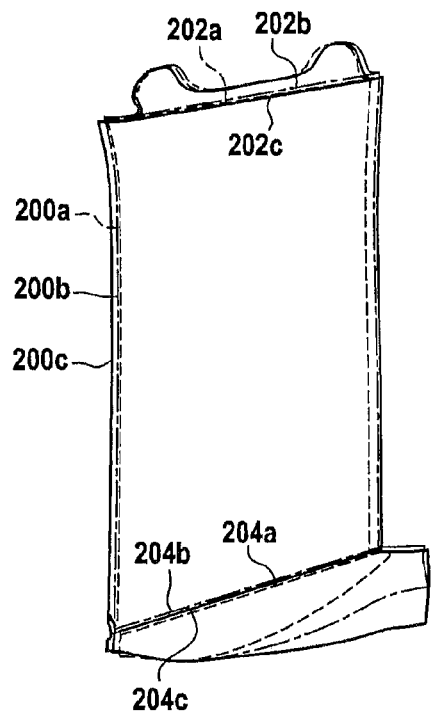

FIG. 4 shows an example of graphically superposing three different 2D geometrical profiles referenced respectively 200a to 200c. In this figure, there can also be seen for each of the geometrical profiles 200a-200c the bottoms 202a-202c of the top regions of non-interlinking and the bottoms 204a-204c of the top regions of non-interlinking (these bottoms of the regions of non-interlinking are the lines up to which the bottom and top regions of non-interlinking extend).

Using the graphics software, the operator then modifies the 2D geometrical profiles as superposed in this way in order to achieve graphical convergence of the profiles in such a manner as to obtain a single 2D geometrical profile for an outlet guide vane preform that is common to all of the outlet guide vane preforms.

The term "convergence" is used to mean that the operator verifies that the superposed 2D geometrical profiles satisfy a certain number of convergence criteria, namely: the outlines of the geometrical profiles of the preform portions constituting the vane airfoils must all be identical (to within a tolerance margin); the positions of the bottoms of the top and bottom regions of non-interlinking should be identical (to within a tolerance margin) for all of the outlet guide vane preforms; and the thickness of geometrical profiles must be identical (to within a tolerance margin) for all of the outlet guide vane preforms.

This convergence step is performed directly by means of the graphics software. In the event of departures that are greater than the predefined tolerance margins for each of the convergence criteria, the operator then modifies the way in which the 3D geometrical profiles of the outlet guide vane preforms are flattened out into 2D geometrical profiles in order once more to verify whether the above-described convergence criteria can be satisfied. This iterative process is continued until 2D geometrical profiles are obtained that satisfy all of the above-specified convergence criteria.

This profile convergence step should thus make it possible to guarantee that a single preform can represent all of the outlet guide vane preforms. In particular, the outlines of the preform portions constituting the vane airfoils must all be identical.

Furthermore, profile convergence is performed by guaranteeing identical positioning for the bottoms of the top and bottom regions of non-interlinking for all of the outlet guide vane preforms.

This step of establishing convergence towards a single 2D geometrical preform profile is also performed by limiting the framing differences between the various 2D geometrical profiles of outlet guide vane preforms (e.g. framing differences must not exceed 10° between the various geometrical profiles).

The term "framing differences" for geometrical profiles refers herein to the deformations imparted to the 2D geometrical profiles by these profiles being shaped in order to obtain the 3D geometrical profiles of preforms for different outlet guide vanes.

Figure 5:
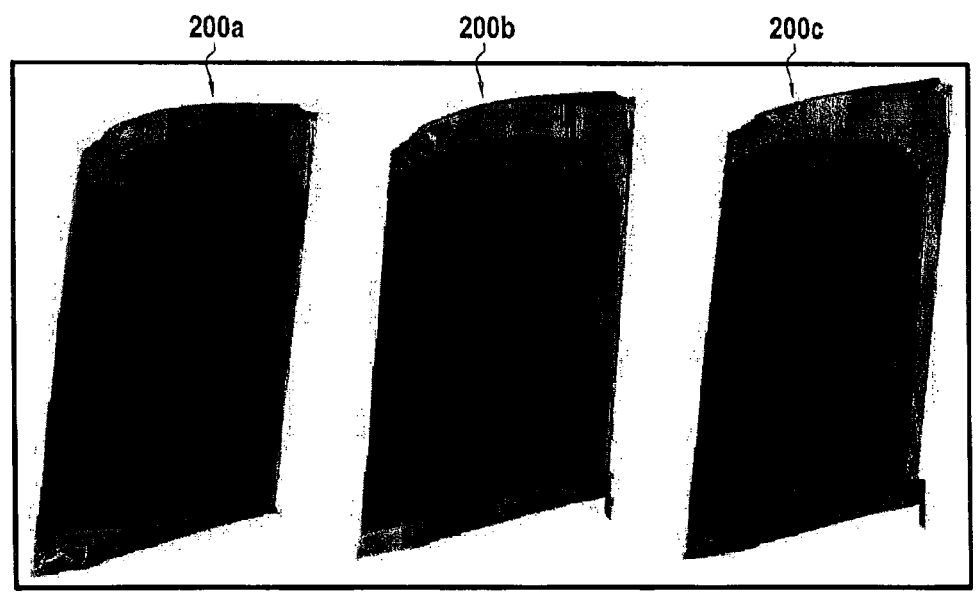

FIG. 5 shows the appearance of framing differences digitally simulated on three different 2D geometrical profiles 200a to 300c for outlet guide vane preforms. In this figure, large deformations are represented by pale zones, whereas small deformations are represented by dark zones.

The deformations to which the profiles are subjected depend on a relationship for the behavior of the 3D woven texture and it is defined on the basis of tests being performed. In practice, these deformations are implemented in software for simulating the shaping of a 3D woven texture, which software is included in the workstation.

In FIG. 5, it can be seen that the various framing differences between the three different geometrical profiles 200a to 300c are relatively small.

Likewise, still while performing the step of establishing convergence towards a single 2D geometrical preform profile, it is preferable to seek to limit thickness differences between the various 2D geometrical profiles of outlet guide vane preforms.

The thickness of the geometrical profiles is simulated using the same simulation software for shaping a 3D woven texture as is used for simulating the deformations. With such software, it is possible to identify a location of the 2D geometrical profile and to determine its destination in the 3D profile. The corresponding location on the 2D profile must therefore present the necessary thickness at its destination point on the 2D profile. This operation is reiterated for all points of the profile of the preform.

It should be observed that the search for convergence between all of the 2D geometrical profiles in order to obtain a single 2D geometrical preform profile by taking account of the above-mentioned requirements (namely identical positioning for the regions of non-interlinking, limiting the framing and thickness differences) is performed using the graphics software of the workstation.

It should also be observed that in the event of divergences between the various geometrical profile preforms that are too great (in terms of outlines, of the positions of the bottoms of the regions of non-interlinking, or of framing differences), the selected draping strategy is modified so as to limit these divergences.

Once the common 2D geometrical profile has been established for all of the outlet guide vane preforms, the profile is used conventionally for defining the 3D woven preforms of the various outlet guide vanes.

It will be appreciated by one skilled in the art that the disclosed arrangements and methods described herein represent a solution to the technological problem currently faced by designers for fabricating outlet guide vanes.

The invention claimed is:

1. A method for manufacturing a turbine engine outlet guide vane wheel comprising a plurality of outlet guide vanes made out of composite material, wherein the outlet guide vanes have different geometrical profiles, the method comprising:

designing a common outlet guide vane preform for outlet guide vane providing a plurality of preforms for outlet guide vanes of different geometrical profiles and made out of composite material, the designing being implemented on at least one machine having one or more processors executing machine-readable instructions from a tangible and non-transitory memory, the common preform being made from a single-piece woven fiber structure obtained by three-dimensional weaving, said fiber structure having first and second portions, each comprising a plurality of layers of yarns and each forming a fraction of the thickness of the fiber structure, the portions of the fiber structure being interlinked while leaving top and bottom regions of non-interlinking separating the first and second portions over respective fractions of the dimension of the fiber structure from opposite edges of the fiber structure, the designing comprising:

3D geometrical modeling, by one or more processors of the at least one machine, of the geometrical profiles of the different outlet guide vane preforms;

flattening, by one or more processors of the at least one machine, out each of the geometrical profiles of the different outlet guide vane preforms;

superposing, by one or more processors of the at least one machine, the geometrical profiles of the different flattened outlet guide vane preforms; and converging, by one or more processors of the at least one machine, towards a single geometrical profile for an outlet guide vane preform common to all of the outlet guide vane preforms while guaranteeing identical positioning for the top and bottom regions of non-interlinking for all of the outlet guide vane preforms; and manufacturing the plurality of the outlet guide vanes from said common outlet guide vane preform.

2. A method according to claim 1, wherein the converging towards a single geometrical profile is performed by limiting the framing differences between the different geometrical profiles for outlet guide vane preforms.

3. A method according to claim 1, wherein the converging towards a single geometrical profile is performed by limiting thickness differences between the different geometrical profiles for the outlet guide vane preforms.

4. A method according to claim 2, wherein the framing differences between the different geometrical profiles for outlet guide vane preforms do not exceed 10° between the various geometrical profiles.

5. A method according to claim 1, wherein the manufacturing includes densifying the common outlet guide vane preform with a matrix.

* * * * *